(12) United States Patent
Choi et al.

(10) Patent No.: US 9,434,801 B2
(45) Date of Patent: *Sep. 6, 2016

(54) POLYMER AND POLYMER ACTUATOR COMPRISING THE SAME

(71) Applicants: SAMSUNG ELECTRONICS CO., LTD., Suwon-si (KR); SUNGKYUNKWAN UNIVERSITY FOUNDATION FOR CORPORATE, Suwon-si (KR)

(72) Inventors: Seung-Tae Choi, Osan-si (KR); Young-kwan Lee, Seoul (KR); Ja-Choon Koo, Seoul (KR); Jong-oh Kwon, Suwon-si (KR); Su-jin Park, Deajeon (KR)

(73) Assignees: SAMSUNG ELECTRONICS CO., LTD., Suwon-si (KR); SUNGKYUNKWAN UNIVERSITY FOUNDATION FOR CORPORATE COLLABORATION, Suwon-si (KR)

(*) Notice: Subject to any disclaimer, the term of this patent is extended or adjusted under 35 U.S.C. 154(b) by 147 days.

This patent is subject to a terminal disclaimer.

(21) Appl. No.: 14/017,591

(22) Filed: Sep. 4, 2013

(65) Prior Publication Data

US 2014/0001924 A1 Jan. 2, 2014

Related U.S. Application Data

(62) Division of application No. 12/704,562, filed on Feb. 12, 2010, now Pat. No. 8,552,623.

(30) Foreign Application Priority Data

Feb. 12, 2009 (KR) .................. 10-2009-0011497

(51) Int. Cl.
*C08F 214/22* (2006.01)
*H01L 41/193* (2006.01)
(Continued)

(52) U.S. Cl.
CPC ............ *C08F 214/22* (2013.01); *B32B 15/08* (2013.01); *B32B 27/08* (2013.01); *B32B 27/26* (2013.01);
(Continued)

(58) Field of Classification Search
USPC ............... 310/363, 365; 525/326.3; 428/421
See application file for complete search history.

(56) References Cited

U.S. PATENT DOCUMENTS 4,375,505 A * 3/1983 Newkirk ............ G03G 15/2057
118/60
4,569,978 A * 2/1986 Barber .................... C08F 14/22
526/206
(Continued)

FOREIGN PATENT DOCUMENTS

EP 6 25 526 A1 11/1994
EP 625526 A1 * 11/1994
(Continued)

OTHER PUBLICATIONS

Korean Intellectual Property Office, Communication dated Mar. 25, 2015 issued in a counterpart Korean application No. 10-2009-0011497.

*Primary Examiner* — Peter D Mulcahy
*Assistant Examiner* — Henry Hu
(74) *Attorney, Agent, or Firm* — Sughrue Mion, PLLC

(57) ABSTRACT

Provided are a polymer and a polymer actuator including the polymer. The polymer is cross-linked by a cross-linking agent. When the polymer is used in the polymer actuator, the polymer actuator shows a high strain and may be stably operated at high temperatures.

7 Claims, 7 Drawing Sheets

(51) Int. Cl.
  *B32B 15/08* (2006.01)
  *B32B 27/08* (2006.01)
  *H01L 41/047* (2006.01)
  *B32B 27/26* (2006.01)
  *B32B 27/28* (2006.01)
  *B32B 27/30* (2006.01)
  *B32B 27/32* (2006.01)

(52) U.S. Cl.
  CPC ............. *B32B 27/28* (2013.01); *B32B 27/304* (2013.01); *B32B 27/322* (2013.01); *H01L 41/0477* (2013.01); *H01L 41/193* (2013.01); *B32B 2255/10* (2013.01); *B32B 2255/205* (2013.01); *B32B 2307/306* (2013.01); *B32B 2307/308* (2013.01); *B32B 2307/50* (2013.01); *B32B 2307/714* (2013.01); *B32B 2457/00* (2013.01); *Y10T 428/3154* (2015.04)

(56) References Cited

U.S. PATENT DOCUMENTS

| | | | |
|---|---|---|---|
| 5,087,679 A * | 2/1992 | Inukai | H01B 3/443 361/317 |
| 5,498,680 A * | 3/1996 | Abusleme | C08F 14/18 526/206 |
| 6,067,438 A | 5/2000 | Chen et al. | |
| 6,075,966 A | 6/2000 | Davis et al. | |
| 6,680,357 B1 * | 1/2004 | Hedhli | C08F 259/08 524/458 |
| 8,552,623 B2 * | 10/2013 | Choi | B32B 7/02 310/363 |
| 2003/0166773 A1 * | 9/2003 | Chen | C08F 214/225 525/70 |
| 2006/0041090 A1 | 2/2006 | Chung et al. | |
| 2006/0147730 A1 | 7/2006 | O'Connell et al. | |
| 2007/0166838 A1 | 7/2007 | Marsman et al. | |
| 2008/0058454 A1 | 3/2008 | Chung | |
| 2008/0081195 A1 | 4/2008 | Chung et al. | |
| 2008/0154004 A1 | 6/2008 | Uschold et al. | |
| 2010/0148635 A1 | 6/2010 | Kwon et al. | |

FOREIGN PATENT DOCUMENTS

| | | |
|---|---|---|
| KR | 10-2008-0083325 A | 9/2008 |
| KR | 10-2008-0100757 A | 11/2008 |
| WO | 2009/005555 A2 | 1/2009 |

\* cited by examiner

US 9,434,801 B2

POLYMER AND POLYMER ACTUATOR COMPRISING THE SAME

CROSS-REFERENCE TO RELATED APPLICATION

This application is a divisional application of U.S. patent application Ser. No. 12/704,562, filed on Feb. 12, 2010, now U.S. Pat. No. 8,552,623, which claims the benefit of Korean Patent Application No. 10-2009-0011497, filed on Feb. 12, 2009, in the Korean Intellectual Property Office, the disclosure of which is incorporated herein in its entirety by reference.

BACKGROUND

1. Field

One or more embodiments relate to a polymer and a polymer actuator including the polymer, which is suitable for use in mobile devices and applied to various areas such as polymer microelectromechanical systems (MEMS) and biology.

2. Description of the Related Art

Polymer sensors and an actuator using a polymer are being widely used in various areas. For example, with regard to highly efficient camera modules for mobile devices, the need of large displacement actuators has increased in order to realize auto focus and zoom functions. An actuator which is made of a ceramic piezoelectric material shows its maximum strain of about 0.1%, whereas an actuator using a polymer shows its maximum strain of about 5%. Thus, research into an actuator that uses a polymer is being actively conducted.

A polymer employed in an actuator includes a ferroelectric polymer, for example, polyvinylidene fluoride (PVDF). PVDF is thermoplastic and has a melting temperature of about 150° C. to about 160° C., and, thus, fragile at high temperatures. Accordingly, a polymer actuator including the PVDF polymer may not stand a solder reflow condition of about 200° C. or above and thus it is difficult to perform a batch process using a solder reflow process. In addition, a relaxor ferroelectric polymer material, such as poly(vinylidene fluoride-trifluoroethylene-chlorofluoroethylene) (P(VDF-TrFE-CFE)) and poly(vinylidene fluoride-trifluoroethylene-chlorotrifluoroethylene) (P(VDF-TrFE-CTFE)), has a melting temperature of about 120 to about 130° C., which is lower than that of the PVDF, and thus is more fragile at high temperatures. Accordingly, use of the polymer actuator using the relaxor ferroelectric polymer material is limited at high temperatures.

SUMMARY

One or more embodiments include a polymer processable at high temperatures and having improved strain, and a polymer actuator including the polymer.

Additional aspects will be set forth in part in the description which follows and, in part, will be apparent from the description, or may be learned by practice of the presented embodiments.

According to one or more embodiments, a polymer includes: a poly vinylidene fluoride (PVDF)-based polymer cross-linked by a cross-linking agent, wherein the PVDF-based polymer comprises: as a first structural unit, vinylidene-fluoride (VDF); as a second structural unit, trifluoroethylene (TrFE) or tetrafluoroethylene (TFE); and as a third structural unit, selected from the group consisting of tetrafluoroethylene, vinyl fluoride, perfluoro (methyl vinyl ether), bromotrifluoroethylene, chlorofluoroethylene, chlorotrifluoroethylene, and hexafluoropropylene.

The PVDF-based terpolymer may include P(VDF(vinylidene-fluoride)-TrFE(trifluoroethylene)-CTFE(chlorotrifluoroethylene)), or P(VDF(vinylidene-fluoride)-TrFE(trifluoroethylene)-CFE(chlorofluoroethylene)).

The cross-linking agent may include at least one selected from the group consisting of dicumyl peroxide (DCP), benzoyl peroxide, bisphenol A, methylenediamine, ethylenediamine (EDA), N-isopropyl ethylenediamine (IEDA), 1,3-Phenylenediamine (PDA), 1,5-Naphthalenediamine (NDA), and 2,4,4-trimethyl-1,6-hexanediamine (THDA).

The content C of the cross-linking agent in the crosslinked PVDF-based terpolymer may be about 0<C (weight percent) ≤10 wt. % based on the total weight of the PVDF-based terpolymer.

The content C of the cross-linking agent in the crosslinked PVDF-based terpolymer may be about 0<C≤5 wt. % based on the total weight of the PVDF-based terpolymer.

According to one or more embodiments, a polymer actuator includes: a first electrode; a polymer layer, formed on the first electrode; and a second electrode, formed in this order, wherein the polymer layer includes a cross-linked poly vinylidene fluoride (PVDF)-based terpolymer.

According to another embodiment, a polymer actuator includes an electrode and a polymer layer formed on one surface of the first electrode, in which the polymer layer includes a cross-linked poly vinylidene fluoride (PVDF)-based terpolymer, and the electrode is a conductive polymer.

The first electrode or the second electrode may be formed of a metal, a conductive metal oxide, or a conductive polymer.

The conductive polymer may include polypyrrole (PPy), poly(3,4-ethylen dioxythiopene) (PEDOT), polyaniline (PANI), polyacetylene, poly(p-pheneylene), polythiophene, poly(p-phenylene vinylene), or poly(thienylene vinylene).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
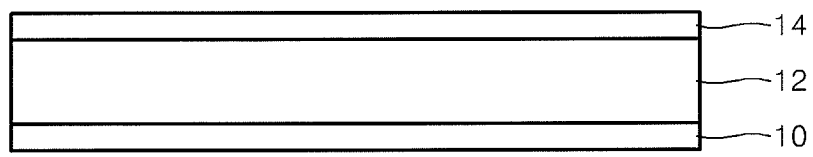
FIG. 1 is a cross-sectional diagram of a polymer actuator including a polymer according to an exemplary embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Hereinafter, a polymer and a polymer actuator including the polymer according to embodiments will be described with reference to the accompanying drawings. In the drawings, the thicknesses of layers and regions are exaggerated for clarity.

FIG. 1 is a cross-sectional diagram of a polymer actuator including a polymer according to an embodiment.

Referring to FIG. 1, a polymer layer 12 is formed on a first electrode 10 and a second electrode 14 is formed on the polymer layer 12.

The first electrode 10 and the second electrode 14 may include a metal used as an electrode material of a general semiconductor device, a conductive metal oxide, or a conductive polymer. The conductive polymer may be a conjugated polymer, which includes, but is not limited to, polypyrrole (PPy), poly (3,4-ethylen dioxythiopene (PEDOT), polyaniline (PANI), polyacetylene, poly(p-pheneylene), polythiophene, poly(p-phenylene vinylene), or poly(thienylene vinylene).

The polymer layer 12 may include a cross-linked polymer material which includes a fluorine-containing monomer or structural (or constitutional) unit. For example, the fluorine-containing monomer is vinylene fluoride, trifluoroethylene (TrFE), tetrafluoroethylene (TFE), perfluoro(methyl vinyl ether), bromotrifluoroethylene, chlorofluoroethylene, chlorotrifluoroethylene, or hexafluoropropylene.

Figure 3A:
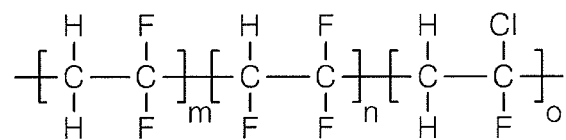
FIG. 3A is a chemical structure of an exemplary poly (vinylidene fluoride-trifluoroethylene-chlorofluoroethylene) (P(VDF-TrFE-CFE))

In an exemplary example, the polymer including a fluorine-containing monomer may be a terpolymer. The term "terpolymer" used herein is intended to mean a polymer containing three or more structural units or monomeric units. The terpolymer according to an embodiment contains vinylidene fluoride as a first monomer unit, and two or more other monomer units. Such terpolymer is sometimes referred to as "PVDF-based polymer" throughout the instant application. The PVDF-based polymer, thus, may include a vinylidene-fluoride (VDF) monomer as a first monomer; trifluoroethylene (TrFE) or tetrafluoroethylene (TFE) as a second monomer; and tetrafluoroethylene, vinyl fluoride, perfluoro(methyl vinyl ether), bromotrifluoroethylene, chlorofluoroethylene, chlorotrifluoroethylene, or hexafluoropropylene, as a third monomer. For example, the PVDF-based terpolymer may include P(VDF(vinylidene-fluoride)-TrFE (trifluoroethylene)-CTFE(chlorotrifluoroethylene)), or P(VDF(vinylidene-fluoride)-TrFE(trifluoroethylene)-CFE (chlorofluoroethylene)). FIG. 3A is a chemical structure of an exemplary P(VDF-TrFE-CFE). The terpolymer may contain a fourth structural unit or monomer selected from any of the above listed monomers. Molar ratios of each structural unit or monomer within the terpolymer are not limited. The terpolymer may be an alternating terpolymer where the structural units are regularly alternating, a periodic terpolymer where the structural units are arranged in a repeating sequence, a statistical or random terpolymer, or a block terpolymer containing three or more homopolymer subunits are linked by covalent bonds. Also, the terpolymer may be linear or branched. Each structural unit of monomer in the terpolymer arranges randomly.

When the PVDF-based terpolymer itself is used in the polymer layer 12 of the polymer actuator, thermal stability is low and the PVDF-based terpolymer may be easily dissolved by a solvent so that its heat and chemical resistance is poor. Thus, in order to improve thermal stability, the polymer layer 12 is cross-linked using a cross-linking agent. In an embodiment, the cross-linking may be performed when the polymer layer 12 is formed on a surface of the electrode.

Figure 3B:
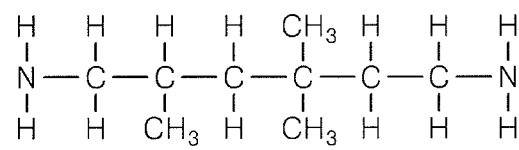
FIG. 3B is a chemical structure of 2,4,4-trimethyl-1,6-hexanediamine (THDA) used as a cross-linking agent.

Examples of the cross-linking agent may include at least one selected from the group consisting of dicumyl peroxide (DCP), benzoyl peroxide, bisphenol A, methylenediamine, ethylenediamine (EDA), N-isopropyl ethylenediamine (IEDA), 1,3-Phenylenediamine (PDA), 1,5-Naphthalenediamine (NDA), and 2,4,4-trimethyl-1,6-hexanediamine (THDA). FIG. 3B shows the chemical formula of THDA.

Even though the polymer actuator shown in FIG. 1 is a sandwich type, one skilled in the art would be able to understand that a polymer actuator using the cross-linked PDVF-based terpolymer according to an embodiment is not limited to such sandwich type, but may include one containing a first metal electrode, one polymer layer, one conductive polymer electrode disposed on only one surface of the polymer layer, and a second metal electrode, formed in this order.

An operating principle of the polymer actuator of FIG. 1 is described as follows. A ferroelectric domain is formed in the polymer layer 12. When a voltage is applied to the polymer layer 12 through the first electrode 10 and the second electrode 14, the polarization of the ferroelectric domain is changed in the polymer layer 12 and a morphological change of the ferroelectric domain is induced in terms of shape. Accordingly, a morphological deformation of the entire polymer layer 12 is generated and thus deformation of the polymer actuator occurs in one direction. A deformation direction of the polymer actuator is selectively adjusted according to a direction of the voltage being applied.

Figure 2:
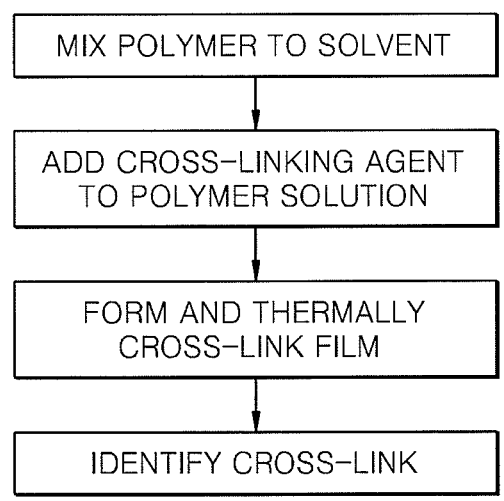
FIG. 2 is a flowchart illustrating a method of manufacturing a polymer according to an exemplary embodiment.

Hereinafter, a method of manufacturing a polymer will be described in more detail with reference to FIG. 2. FIG. 2 is a flowchart illustrating a method of manufacturing a polymer according to an embodiment of the present invention.

Referring to FIG. 2, a PVDF-based polymer material is added to a solvent and is mixed to form a polymer solution. Here, the solvent may be methyl isobutyl ketone (MIBK) or methyl ethyl ketone (MEK). For example, about 5 wt. % of the PVDF-based polymer is added to the solvent and is mixed for about a few hours to about several tens of hours at room temperature or by applying heat.

Then, a cross-linking agent is added to the polymer solution. Examples of the cross-linking agent may include dicumyl peroxide (DCP), benzoyl peroxide, bisphenol A, methylenediamine, ethylenediamine (EDA), N-isopropyl ethylenediamine (IEDA), 1,3-Phenylenediamine (PDA), 1,5-Naphthalenediamine (NDA), and 2,4,4-trimethyl-1,6-hexanediamine (THDA). The content C of the cross-linking agent is about 0<C (weight percent) ≤10 wt. % based on the total weight of the PVDF-based terpolymer. In consideration of thermal stability and deformation of the polymer actuator, the cross-linking agent having the content C of about 0<C ≤5 wt. % may be added. For example, about 2 wt. % of THDA is added to the polymer solution and mixed for about 2 hours at room temperature. FIG. 3B is a chemical structure of THDA used as the cross-linking agent.

Figure 3C:
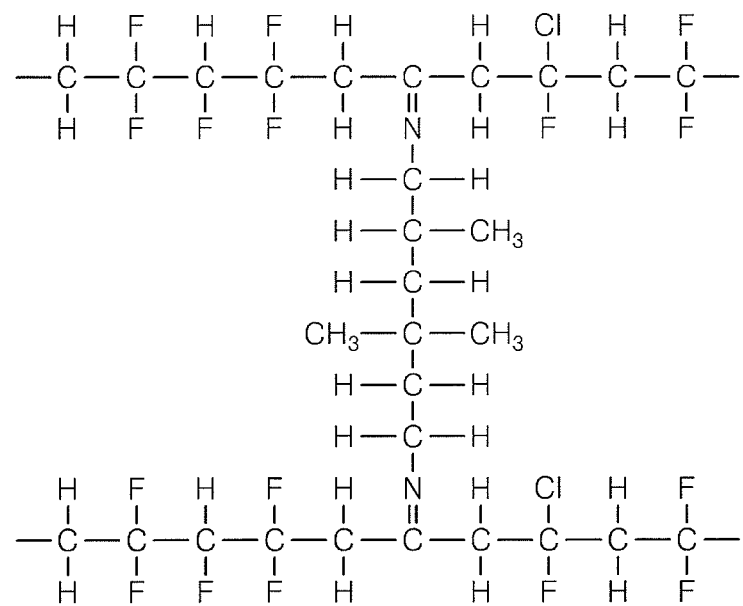
FIG. 3C is a chemical structure of an exemplary P(VDF-TrFE-CFE) cross-linked by THDA.

Then, a film is manufactured using the polymer solution including the cross-linking agent. For example, a film is formed using solution casting, then the solvent is evaporated for a few hours at room temperature, and thermal cross-linking is performed in an oven at temperature in the range of about 100° C. to about 200° C. Thus, the PVDF-based polymer that is cross-linked by the cross-linking agent may be formed. FIG. 3C is a chemical structure of an exemplary P(VDF-TrFE-CFE) cross-linked by THDA.

After the film is manufactured, the resulting film may be examined to determine whether the PVDF-based polymer is crosslinked by THDA. For this, a differential scanning calorimeter (DSC) analysis, a dynamic mechanical analysis (DMA) analysis, and a solubility test may be performed. For example, in the DSC analysis, the amounts of crystallization ($\Delta H$) at a DSC peak in a PVDF polymer before and after the crosslinking are compared and the amount of crystallization ($\Delta H$) in the cross-linked PVDF polymer is lower than that of the PVDF polymer prior to the crosslinking reaction. As the PVDF polymer is cross-linked by a cross-linking agent, chains of the PVDF polymer molecules are linked to each other. In the DMA analysis, the glass transition temperatures (Tg) of a PVDF polymer prior to and after the cross-linking reaction are measured and the Tg in the cross-linked PVDF polymer increases. Also, the cross-linked PVDF polymer shows increased loss modulus and storage modulus values than the PVDF polymer prior to the cross-linking.

Figure 4A:
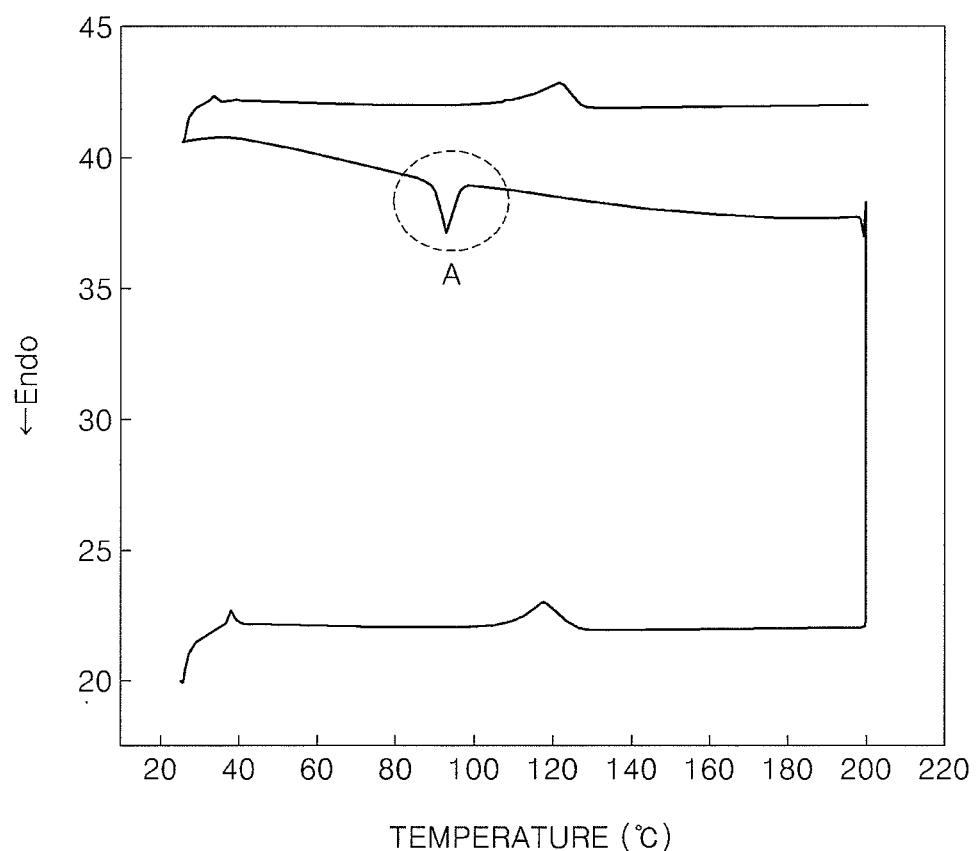
FIGS. 4A and 4B are graphs illustrating results of a differential scanning calorimeter (DSC) analysis for P(VDF-TrFE-CFE), before and after being cross-linked, respectively.
Figure 4B:
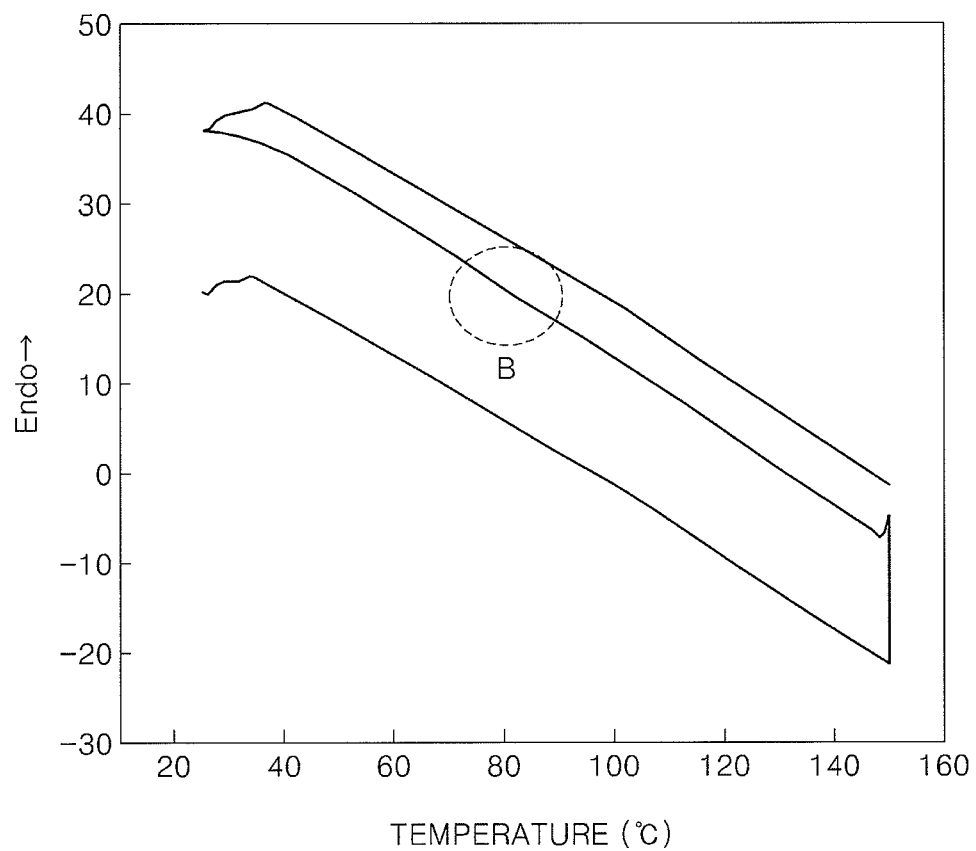

FIGS. 4A and 4B are graphs illustrating results of the DSC analysis for P(VDF-TrFE-CFE), which is the PVDF-based polymer before and after being cross-linked, respectively. FIG. 4A is a graph of the DSC analysis for a PVDF-based polymer film before being cross-linked. FIG. 4B is a graph of the DSC analysis for the PVDF-based polymer film after being cross-linked. In this test, P(VDF-TrFE-CTFE) was used as the PVDF-based polymer and MIBK was used as a solvent. About 5 wt. % of P(VDF-TrFE-CTFE) was added to MIBK and was mixed for about 48 hours at room temperature so as to form a PVDF-based solution. Then, about 2.0 wt. % of THDA, as a cross-linking agent, was added to the PVDF-based solution and was mixed for about 2 hours at room temperature. A film was manufactured using the PVDF solution including the cross liking agent, and the solvent was evaporated for about 6 hours at room temperature. Then, thermal cross-linking was performed for about 30 minutes in a vacuum oven at about 170° C. In order to determine whether to cross-link the PVDF-based polymer formed through the above processes, a thermal change was measured using a DSC. The heating rate was fixed to about 10° C./min under a nitrogen atmosphere and the DSC was used to measure at a temperature in the range of about 25° C. to about 150° C.

Referring to FIGS. 4A and 4B, the amount of crystallization ($\Delta H$) of the PVDF-based polymer (P(VDF-TrFE-CTFE)) before being cross-linked was about $-53.33$ mJ, whereas the amount of crystallization ($\Delta H$) of the PVDF-based polymer cross-linked by about 2.0 wt. % of THDA was about $-4.399$ mJ. Accordingly, at a melting point (Tm) peak obtained from the result of the DSC measurement, an area formed by the peak was analyzed and the amount of crystallization ($\Delta H$) was analyzed. From the results, it was confirmed that the amount of crystallization ($\Delta H$) in the cross-linked PVDF-based polymer film decreased and consequently, cross-liking was well accomplished. When the cross-linking is performed, chains are linked together and the heat of reaction decreases.

In order to determine whether the PVDF-based polymer is cross-linked, a solubility test may be performed. When the PVDF-based polymer is cross-linked, chains of the polymer molecules are linked together and thus the chains are not dissolved in the solvent used for performing cross-linking. When the resulting PVDF-based polymer after cross-linking reaction was added to a solvent such as MIBK or MEK, the resulting PVDF-based polymer showed a decreased solubility and thus it could be determined that the cross-linking was accomplished.

In addition, when an electrode forming process is performed to both sides of the cross-linked PVDF-based polymer, a ferroelectric polymer actuator may be formed. The electrode forming process may be performed using a general depositing process and a metal or a conductive metal oxide may be formed on both sides of the cross-linked PVDF-based polymer.

Figure 5A:
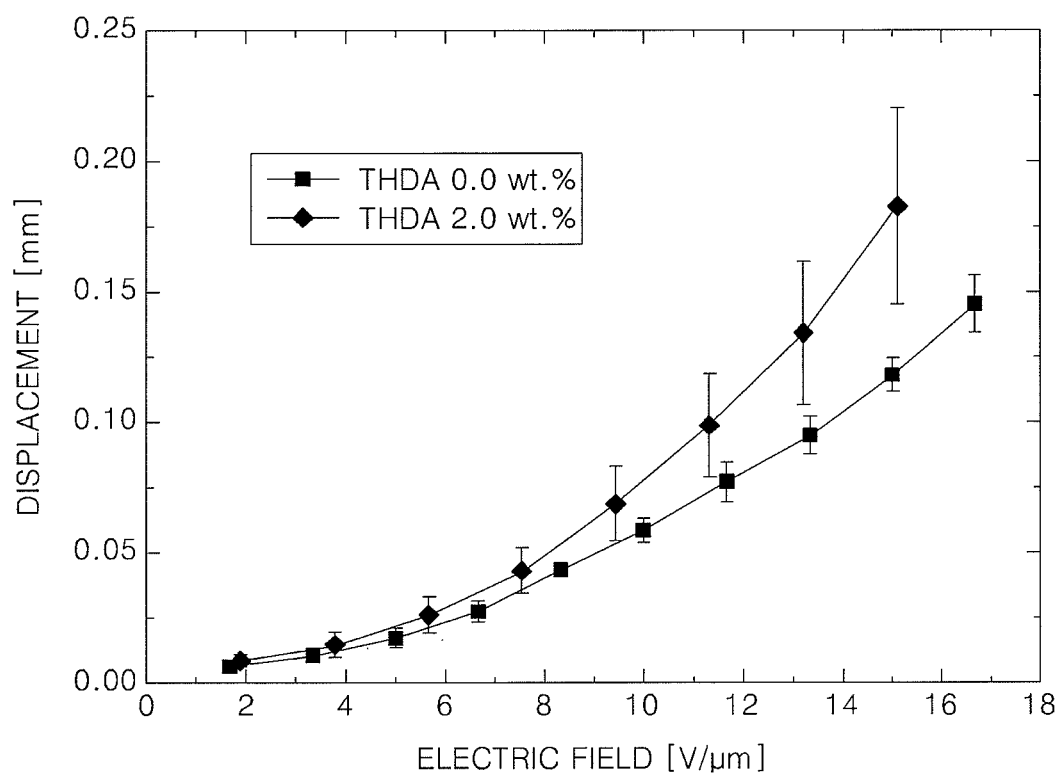
FIG. 5A is a graph illustrating a result of measurements on the performance of a polymer actuator including P(VDF-TrFE-CFE) cross-linked by THDA.

FIG. 5A is a graph illustrating a result of measurements on the performance of a polymer actuator including the P(VDF-TrFE-CFE) cross-linked by about 2.0% THDA. The performance of the polymer actuator including P(VDF-TrFE-CFE) cross-linked by adding about 2.0 wt. % of THDA was increased by about 30%, compared with that of the polymer actuator including a non-crosslinked P(VDF-TrFE-CFE) (THDA 0.0 wt %).

Figure 5B:
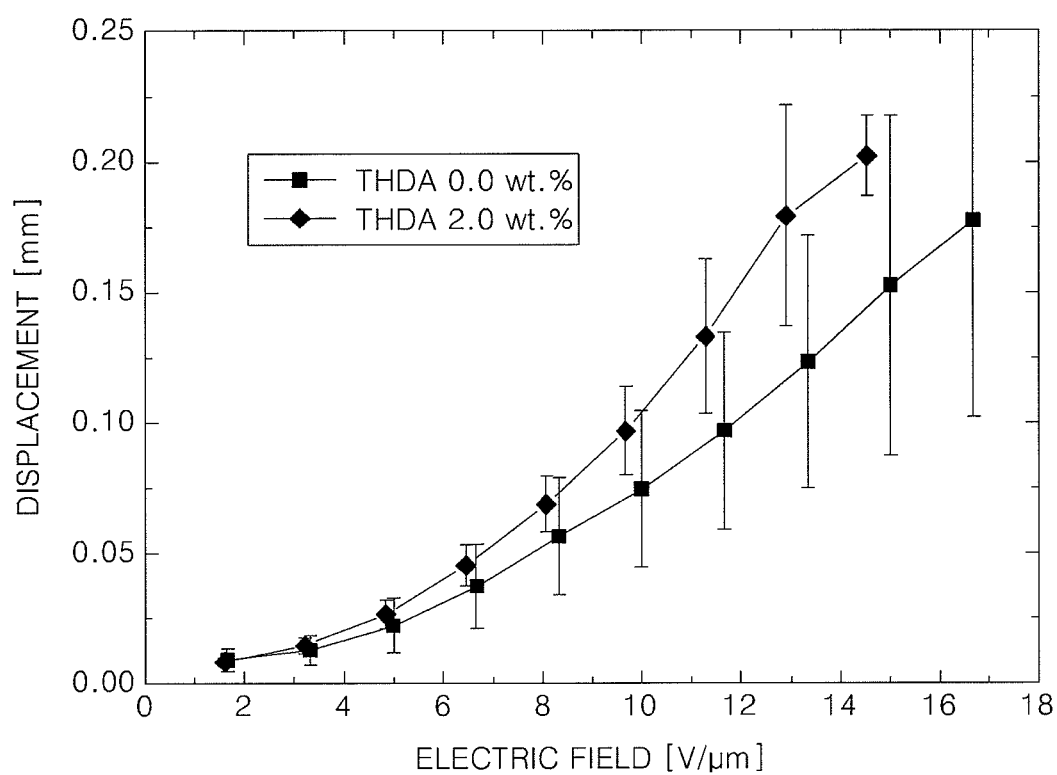
FIGS. 5B and 5C are graphs illustrating results of measurements on the performances of polymer actuators including P(VDF-TrFE-CFE) cross-linked by THDA and without a cross-linking agent, respectively, after the polymer actuators experience temperature history for about 1 minute in ovens at about 225° C. and about 250° C., respectively, in order to find out a high temperature heat resistance characteristic of the polymer actuator including P(VDF-TrFE-CFE) cross-linked by THDA.
Figure 5C:
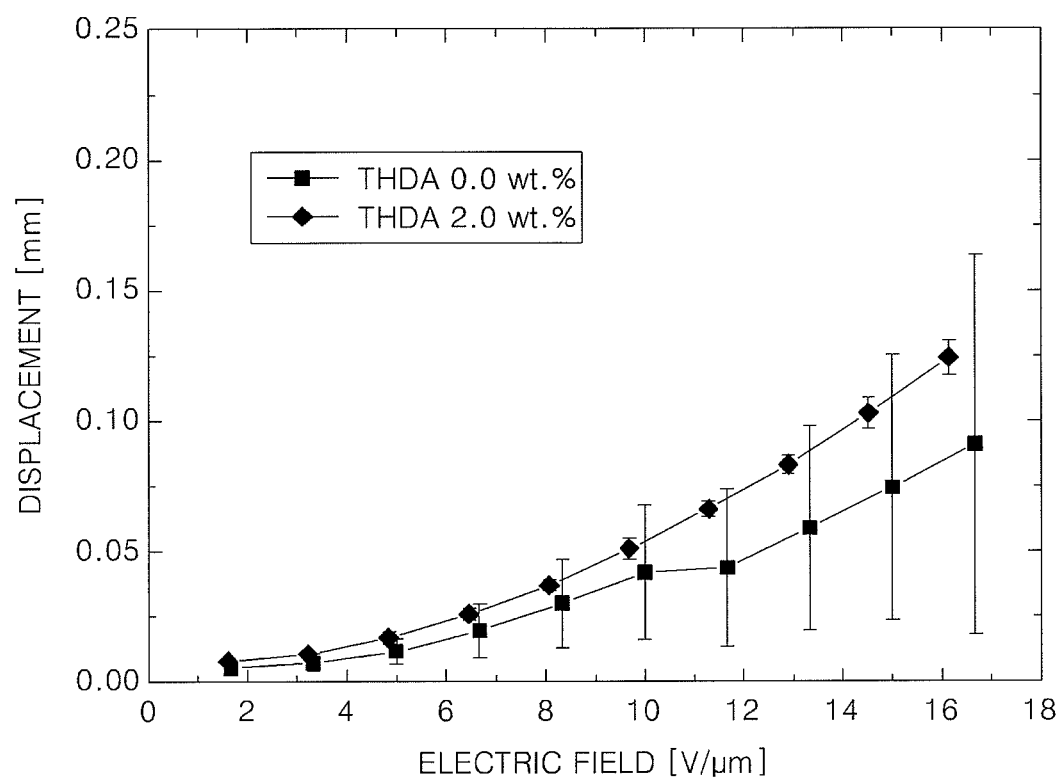

FIGS. 5B and 5C are graphs illustrating results of measurements on the performances of the polymer actuators including the P(VDF-TrFE-CFE) cross-linked by 2% THDA and the corresponding P(VDF-TrFE-CFE) without cross-linking, after the polymer actuators experienced a temperature history for about 1 minute in ovens at about 225° C. and about 250° C., respectively, in order to find out a high temperature heat resistance characteristic of the polymer actuator including P(VDF-TrFE-CFE) cross-linked by THDA.

Referring to FIG. 5B, the performance of the polymer actuator including P(VDF-TrFE-CFE) cross-linked by THDA after experiencing the temperature history for about 1 minute at about 225° C. was not significantly changed, whereas the distribution of the polymer actuator including the corresponding P(VDF-TrFE-CFE) without cross-linking greatly increased, showing the polymer actuator including a non-crosslinked P(VDF-TrFE-CFE) was fragile to heat.

Referring to FIG. 5C, the performances of the polymer actuators decrease regardless of the inclusion of the cross-linking agent after experiencing the temperature history for about 1 minute at about 250° C. However, the polymer actuator including a P(VDF-TrFE-CFE) cross-linked by THDA showed reduced performance deterioration and distribution.

Consequently, a polymer actuator including P(VDF-TrFE-CFE) cross-linked by THDA has improved operating performance after experiencing temperature history at room temperature and high temperature, compared with the polymer actuator including a non-crosslinked P(VDF-TrFE-CFE).

According to embodiments, a PVDF-based polymer having improved thermal characteristic is formed by subjecting it cross-linking reaction so that a polymer processable at high temperatures and a polymer actuator using the polymer may be provided.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A polymer actuator comprising:
 a first electrode;
 a polymer layer, formed on the first electrode, comprising a poly vinylidene fluoride (PVDF)-based terpolymer cross-linked by a cross-linking agent; and
 a second electrode formed on the polymer layer,
 wherein the cross-linking agent comprises at least one selected from the group consisting of methylenediamine, ethylenediamine, N-isopropyl ethylenediamine, 1,3-phenylenediamine, 1,5-naphthalenediamine, and 2,4,4-trimethyl-1,6-hexanediamine.

2. The polymer actuator of claim 1, wherein the PVDF-based terpolymer comprises: as a first structural unit, vinylidene fluoride monomer; as a second structural unit, trifluoroethylene or tetrafluoroethylene; and as a third structural unit, vinyl fluoride, perfluoro (methyl vinyl ether), bromotrifluoroethylene, chlorofluoroethylene, chlorotrifluoroethylene, or hexafluoropropylene.

3. The polymer actuator of claim 1, wherein the PVDF-based terpolymer comprises a poly((vinylidene fluoride)-(trifluoroethylene)-(chlorotrifluoroethylene)), or poly((vinylidene fluoride)-(trifluoroethylene)-(chlorofluoroethylene)).

4. The polymer actuator of claim 1, wherein the content C of the cross-linking agent in the crosslinked terpolymer is about $0<C$ (weight percent) $\leq 10$ wt. %.

5. The polymer actuator of claim 4, wherein the content C of the cross-linking agent in the crosslinked terpolymer is about $0<C \leq 5$ wt. %.

6. The polymer actuator of claim 1, wherein the first electrode or the second electrode is formed of a metal, a conductive metal oxide, or a conductive polymer.

7. The polymer actuator of claim 6, wherein the conductive polymer comprises polypyrrole, poly(3,4-ethylenedioxy thiophene, polyaniline, polyacetylene, poly(p-phenylene), polythiophene, poly(p-phenylene vinylene), or poly(thienylene vinylene).

* * * * *